(12) United States Patent
Lee et al.

(10) Patent No.: US 9,343,535 B2
(45) Date of Patent: May 17, 2016

(54) SEMICONDUCTOR PACKAGES HAVING A GUIDE WALL AND RELATED SYSTEMS AND METHODS

(71) Applicants: Jung-Do Lee, Uiwang-Si (KR);
Tae-Woo Kang, Suwon-si (KR);
Dong-Han Kim, Osan-si (KR);
Jang-Woo Lee, Cheonan-si (KR)

(72) Inventors: Jung-Do Lee, Uiwang-Si (KR);
Tae-Woo Kang, Suwon-si (KR);
Dong-Han Kim, Osan-si (KR);
Yang-Hoon Ahn, Asan-si (KR);
Jang-Woo Lee, Cheonan-si (KR);
Dae-Young Choi, Yeosu-si (KR)

(73) Assignee: Samsung Electronics Co., Ltd. (KR)

( * ) Notice: Subject to any disclaimer, the term of this patent is extended or adjusted under 35 U.S.C. 154(b) by 55 days.

(21) Appl. No.: 14/019,638

(22) Filed: Sep. 6, 2013

(65) Prior Publication Data

US 2014/0084442 A1 Mar. 27, 2014

(30) Foreign Application Priority Data

Sep. 25, 2012 (KR) ........................ 10-2012-0106600

(51) Int. Cl.
*H01L 23/34* (2006.01)
*H01L 29/34* (2006.01)
(Continued)

(52) U.S. Cl.
CPC .............. *H01L 29/34* (2013.01); *H01L 21/563* (2013.01); *H01L 21/565* (2013.01); *H01L 23/3675* (2013.01); *H01L 23/42* (2013.01); *H01L 23/4334* (2013.01); *H01L 23/49811* (2013.01); *H01L 24/97* (2013.01); *H01L 25/105* (2013.01); *H01L 29/1033* (2013.01); *H01L 23/3128* (2013.01); *H01L 2224/16225* (2013.01); *H01L 2224/32225* (2013.01); *H01L 2224/45139* (2013.01); *H01L 2224/48095* (2013.01); *H01L 2224/48227* (2013.01); *H01L 2224/73204* (2013.01); *H01L 2224/73253* (2013.01); *H01L 2224/73265* (2013.01); *H01L 2224/97* (2013.01); *H01L 2225/1023* (2013.01); *H01L 2225/1058* (2013.01); *H01L 2225/1076* (2013.01); *H01L 2225/1094* (2013.01);
(Continued)

(58) Field of Classification Search
CPC .... H01L 23/34; H01L 21/565; H01L 23/3675
See application file for complete search history.

(56) References Cited

U.S. PATENT DOCUMENTS 6,410,981 B2 6/2002 Tao
6,486,562 B1 11/2002 Kato
(Continued)

FOREIGN PATENT DOCUMENTS

JP 2002-190560 7/2002
JP 2005-183658 7/2005
(Continued)

*Primary Examiner* — Amar Movva
(74) *Attorney, Agent, or Firm* — Myers Bigel & Sibley, PA

(57) ABSTRACT

A semiconductor package includes a first package board, a first semiconductor chip arranged on the first package board, a heat transfer layer arranged on the first semiconductor chip, a heat spreader arranged on the heat transfer layer, and a housing having a molding part arranged on the first package board and directly surrounding side surfaces of the first semiconductor chip and a guide wall arranged on the molding part, with the guide wall spaced apart from the heat spreader and surrounding side surfaces of the heat spreader.

15 Claims, 23 Drawing Sheets

(51) Int. Cl.
*H01L 29/10* (2006.01)
*H01L 23/367* (2006.01)
*H01L 23/00* (2006.01)
*H01L 23/42* (2006.01)
*H01L 23/433* (2006.01)
*H01L 21/56* (2006.01)
*H01L 25/10* (2006.01)
*H01L 23/498* (2006.01)
*H01L 23/31* (2006.01)

(52) U.S. Cl.
CPC ........... *H01L 2924/10271* (2013.01); *H01L 2924/15174* (2013.01); *H01L 2924/15311* (2013.01); *H01L 2924/181* (2013.01); *H01L 2924/1815* (2013.01)

(56) References Cited

U.S. PATENT DOCUMENTS

| | | | |
|---|---|---|---|
| 6,593,652 B2 | 7/2003 | Shibata | |
| 6,784,113 B2 * | 8/2004 | Hembree | H01L 21/4871 257/E23.125 |
| 7,371,617 B2 | 5/2008 | Tsai et al. | |
| 7,498,673 B2 * | 3/2009 | Awad | H01L 23/3675 174/545 |
| 2003/0011053 A1 | 1/2003 | Yasunaga | |
| 2010/0096747 A1 | 4/2010 | Kusano | |

FOREIGN PATENT DOCUMENTS

| | | |
|---|---|---|
| KR | 1020110049942 | 5/2001 |
| KR | 1020020093474 | 12/2002 |
| KR | 1020030046795 | 6/2003 |
| KR | 1020100069007 | 6/2010 |
| KR | 1020120025751 | 3/2012 |

\* cited by examiner

SEMICONDUCTOR PACKAGES HAVING A GUIDE WALL AND RELATED SYSTEMS AND METHODS

CROSS-REFERENCE TO RELATED APPLICATION

This application claims priority under 35 U.S.C. §119 to Korean Patent Application No. 10-2012-0106600, filed on Sep. 25, 2012, the disclosure of which is hereby incorporated by reference in its entirety.

FIELD

Embodiments of the inventive concept relate to semiconductor packages having a guide wall.

BACKGROUND

It may be desirable for a mobile product to have a small and thin semiconductor package. Heat dissipation capability of a semiconductor package is an important issue.

SUMMARY

In accordance with an aspect of the inventive concept, a semiconductor package includes a first package board, a first semiconductor chip arranged on the first package board, a heat transfer layer arranged on the first semiconductor chip, a heat spreader arranged on the heat transfer layer, and a housing. The housing includes a molding part arranged on the first package board and directly surrounding side surfaces of the first semiconductor chip and a guide wall arranged on the molding part, with the guide wall spaced apart from the heat spreader and surrounding side surfaces of the heat spreader.

In some embodiments, the guide wall may surround four side surfaces of the heat spreader.

In other embodiments, the guide wall may define a cavity in which the heat spreader is arranged on the first semiconductor chip.

In still other embodiments, the guide wall may define an inner horizontal surface on a top surface of the molding part.

In yet other embodiments, the heat transfer layer may cover an entire top surface of the first semiconductor chip and a portion of the inner horizontal surface.

In yet other embodiments, the top surface of the first semiconductor chip and the inner horizontal surface may be substantially coplanar.

In yet other embodiments, the guide wall and the molding part may form a monolithic structure.

In yet other embodiments, the semiconductor package may further include a second package board arranged on the housing, a second semiconductor chip arranged on the second package board, and a plurality of inter-package bumps arranged between a bottom surface of the second package board and a top surface of the first package board, with each inter-package bump passing through the housing.

In yet other embodiments, the inter-package bumps may pass through the heat spreader.

In yet other embodiments, the heat spreader may include through-holes through which the inter-package bumps pass.

In accordance with another aspect of the inventive concept, a semiconductor package includes a package board, a semiconductor chip arranged on the package board, a molding part arranged on the package board and surrounding side surfaces of the semiconductor chip, a heat transfer layer, a heat spreader arranged on the heat transfer layer; and a guide wall. The molding part includes a top surface outer periphery and an inner top surface extending inwardly from the top surface outer periphery. The heat transfer layer is formed on at least a portion of the inner top surface of the molding part. The guide wall extends away from the top surface outer periphery of the molding part, and the guide wall is spaced apart from the heat spreader and surrounds side surfaces of the heat spreader.

In some embodiments, the molding part may include an opening that exposes a top surface of the semiconductor chip, and the heat transfer layer may cover the entire top surface of the semiconductor chip and expose a portion of the inner top surface of the molding part.

In other embodiments, the molding part may include an opening that exposes a top surface of the semiconductor chip, and the heat transfer layer may fully cover the top surface of the semiconductor chip and the inner top surface of the molding part.

In still other embodiments, the molding part may include a first through-hole extending downwardly from the inner top surface of the molding part and exposing a portion of a surface of the package board.

In yet other embodiments, the heat spreader may include a second through-hole aligned with the first through-hole.

In accordance with another aspect of the inventive concept, a semiconductor package includes a package board, a semiconductor chip arranged on the package board, a housing that surrounds side surfaces of the semiconductor chip, a heat transfer layer and a heat spreader arranged on the heat transfer layer. The housing includes a perimeter wall that extends substantially perpendicularly away from the upper surface of the semiconductor chip, and the housing also includes an inner upper surface extending inwardly from a base of the perimeter wall. The heat transfer layer is arranged on at least a portion of the inner upper surface of the housing. The perimeter wall is spaced apart from the heat spreader and at least partially surrounds side surfaces of the heat spreader.

In some embodiments, the housing surrounds the upper surface of the semiconductor chip. In some embodiments, the housing includes an opening exposing the upper surface of the semiconductor chip, and the upper surface of the semiconductor chip and the inner upper surface of the housing are substantially coplanar. In some embodiments, the perimeter wall extends past an upper surface of the heat spreader such that the perimeter wall completely surrounds the side surfaces of the heat spreader. In some embodiments, the upper surface of the heat spreader extends past the perimeter wall such that the perimeter wall partially surrounds the side surfaces of the heat spreader.

Details of other embodiments are included in the detailed description and drawings.

DETAILED DESCRIPTION OF THE EMBODIMENTS

Figure 1A:
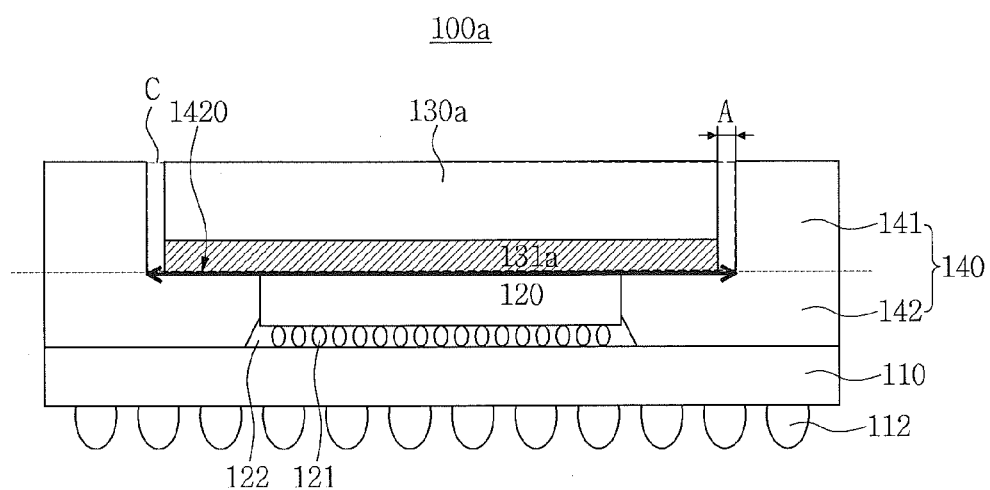
FIG. 1A is a side cross-sectional view schematically showing a semiconductor package in accordance with embodiments of the inventive concept.

Various embodiments of the inventive concept will now be described more fully with reference to the accompanying drawings in which some embodiments are shown. The inventive concept may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 1D are side cross-sectional views and a top view schematically showing semiconductor packages in accordance with embodiments of the inventive concept. For easier understanding of the inventive concept, the semiconductor chip and the package board are illustrated in a side view, and the housing is illustrated in a schematic cross-sectional view.

Figure 1B:
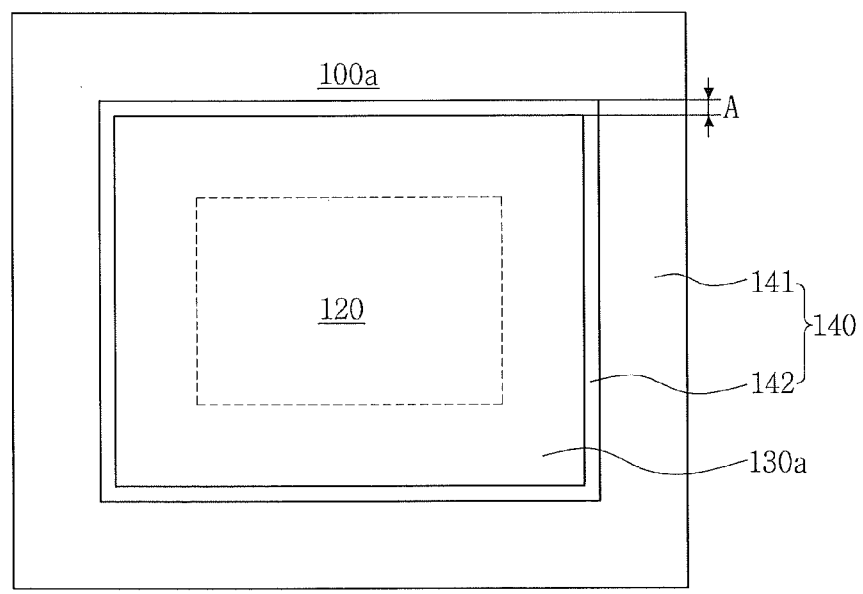
FIG. 1B is a top view schematically showing the semiconductor package of FIG. 1A.

Referring to FIGS. 1A and 1B, a semiconductor package 100a in accordance with an embodiment of the inventive concept may include a package board 110, a semiconductor chip 120 arranged on the package board 110, and a heat spreader 130a and housing 140 arranged on the semiconductor chip 120.

The package board 110 may be or include a rigid printed circuit board, a flexible printed circuit board, or a rigid-flexible printed circuit board. Solder balls 112 may be arranged in or on the bottom surface of the package board 110.

The semiconductor chip 120 may be or include a logic semiconductor device such as a microprocessor. The semiconductor chip 120 may be connected by a flip chip method using chip bumps 121 arranged on the package board 110. The chip bumps 121 may be or include a mesa-type metal pad or a solder material. Under-fill material 122 surrounding the chip bumps 121 may fill a region or space between the semiconductor chip 120 and the package board 110. The under-fill material 122 may be or include a resin (e.g., an adhesive resin).

The housing 140 may include a molding part 142 and a guide wall 141 disposed on the molding part 142. For example, the housing 140 may include a guide wall 141 that defines a cavity C in which a heat spreader 130a is arranged on the molding part 142. The guide wall 141 may also be referred to as an outer periphery wall and a perimeter wall. An inner horizontal surface 1420 may be delimited on a top surface of the molding part 142 by the guide wall 141. The housing 140 may be or include an Epoxy Molding Compound (EMC) used in a transfer molding, an injection molding, an under-fill, etc.

The molding part 142 may be arranged on the package board 110 to directly surround side surfaces of the under-fill material 122 and semiconductor chip 120. The inner horizontal surface 1420 may be located at the same level as or a similar level to the semiconductor chip 120. For example, the inner horizontal surface 1420 and a top surface of the semiconductor chip 120 may be coplanar or substantially coplanar. A top surface of the semiconductor chip 120 may be not covered with the molding part 142 (e.g., the top surface of the semiconductor chip 120 may be exposed). For example, the inner horizontal surface 1420 and/or the top surface of the molding part 142 exposed by the cavity C may extend around outer edges or a perimeter of the semiconductor 120 when viewed from the top. That is, the inner horizontal surface 1420 and/or the top surface of the molding part 142 have an opening exposing the semiconductor 120. The guide wall 141 may be spaced apart from and surround the heat spreader 130a. A top surface of the guide wall 141 may be located at a similar level to or substantially the same level as a top surface of the heat spreader 130a (e.g., these surfaces may be coplanar or substantially coplanar). The guide wall 141 and the molding part 142 may be one body. For example, the guide wall 141 and the molding part 142 may be physically continuous and/or may form a monolithic structure.

The heat spreader 130a may be attached on the top surface of the semiconductor chip 120 and inside of the housing 140 by a heat transfer layer 131a. For example, the heat spreader 130a may be attached to the inner horizontal surface 1420 of the molding part 142. The heat spreader 130a may be formed of or include a metal material such as copper, aluminum, or an alloy, etc.

The heat transfer layer 131a may be applied on the top surface of the semiconductor chip 120 and on a part/portion of or the entire inner horizontal surface 1420 of the molding part 142. The heat transfer layer 131a may be in direct contact with the top surface of the semiconductor chip 120 and/or a bottom surface of the heat spreader 130a. The heat transfer layer 131a may be applied on the inner horizontal surface 1420 using a tape or a liquid material, for example. The heat transfer layer 131a may be formed of or include a thermal interface material (TIM).

The heat transfer layer 131a may fully cover the top surface of the semiconductor chip 120. The heat transfer layer 131a may fully cover the bottom surface of the heat spreader 130a. In some embodiments, the horizontal width of the heat transfer layer 131a may be greater than that of the heat spreader 130a by about 100 μm to 200 μm. The heat transfer layer 131a may cover a part or portion and expose another part or portion of the inner horizontal surface 1420 of the molding part 142. The heat transfer layer 131a, referring to FIG. 1B, may be spaced apart from the guide wall 141 by a predetermined distance A, as viewed from the top.

Figure 1C:
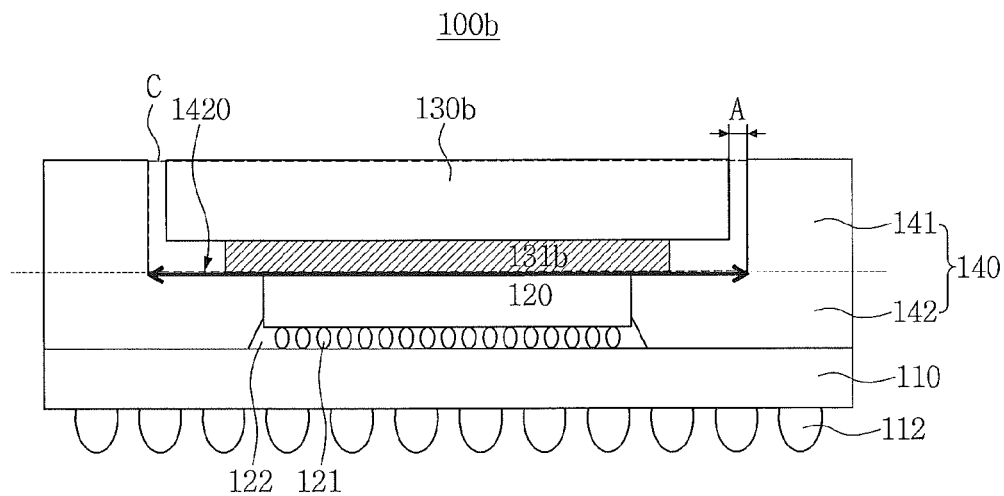
FIG. 1C is a side cross-sectional view schematically showing a semiconductor package in accordance with embodiments of the inventive concept.

Referring to FIG. 1C, a semiconductor package 100b in accordance with embodiments of the inventive concept may include a heat transfer layer 131b fully covering the top surface of the semiconductor chip 120 and formed on a part or portion of the inner horizontal surface 1420 of the molding part 142. For example, the heat transfer layer 131b may cover a part or portion and expose another part or portion of the inner horizontal surface 1420 of the molding part 142. The heat transfer layer 131b may cover a part or portion and expose another part or portion of a bottom surface of a heat spreader 130b.

Figure 1D:
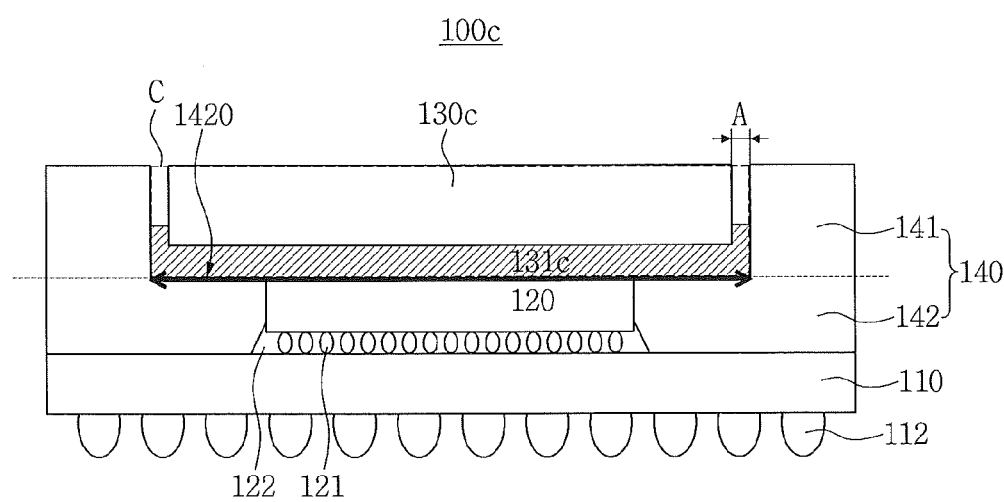
FIG. 1D is a side cross-sectional view schematically showing a semiconductor package in accordance with embodiments of the inventive concept.

Referring to FIG. 1D, a semiconductor package 100c in accordance with embodiments of the inventive concept may include a heat transfer layer 131c in contact with the guide wall 141. For example, the heat transfer layer 131c may fully cover the inner horizontal surface 1420 of the molding part 142 and a bottom surface of a heat spreader 130c. The heat transfer layer 131c may surround parts or portions of side surfaces of the heat spreader 130c (e.g., a portion of each side surface of the heat spreader 130c).

Figure 2A:
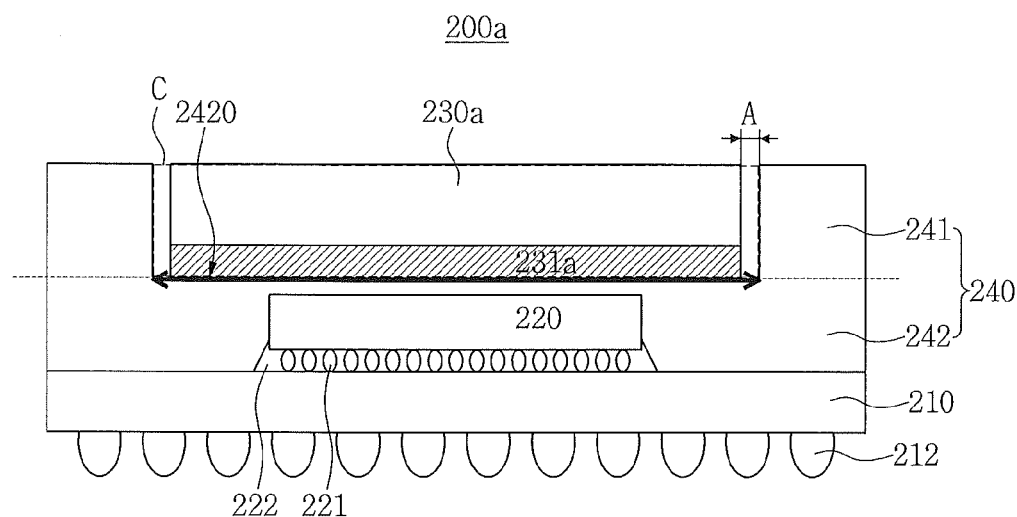
FIG. 2A is a side cross-sectional view schematically showing a semiconductor package in accordance with embodiments of the inventive concept.
Figure 2B:
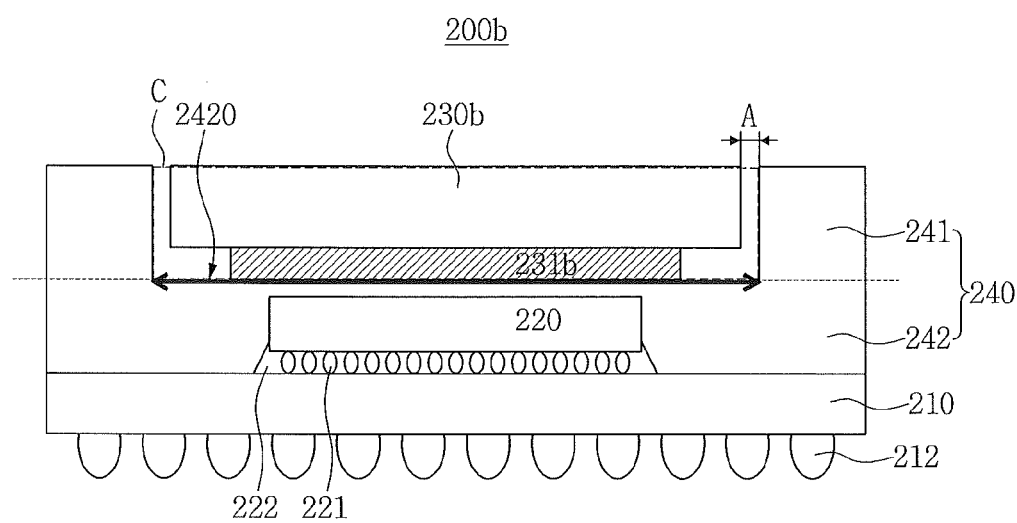
FIG. 2B is a side cross-sectional view schematically showing a semiconductor package in accordance with embodiments of the inventive concept.
Figure 2C:
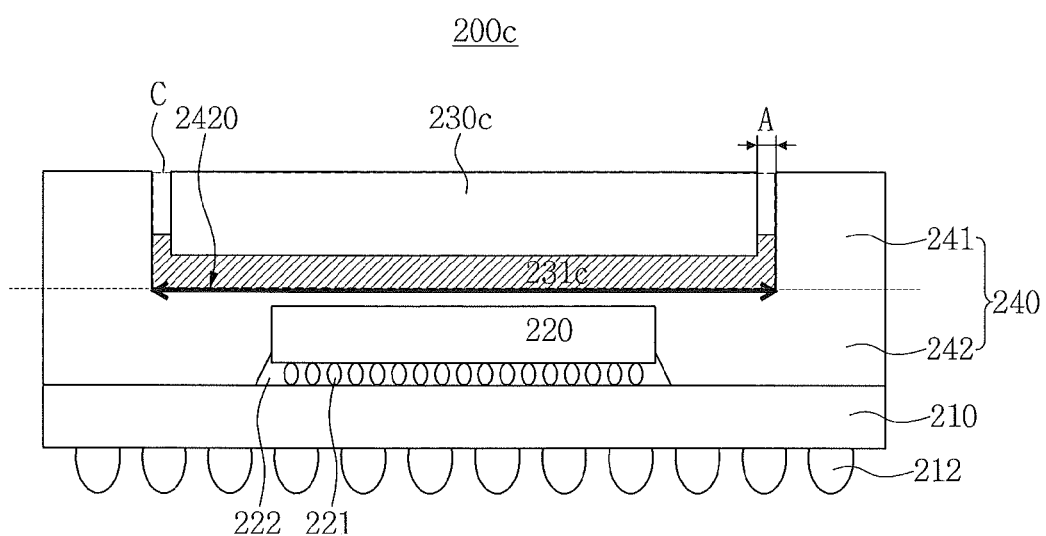
FIG. 2C is a side cross-sectional view schematically showing a semiconductor package in accordance with embodiments of the inventive concept.

FIGS. 2A to 2C are side cross-sectional views schematically showing semiconductor packages in accordance with embodiments of the inventive concept.

Referring to FIG. 2A, a semiconductor package 200a in accordance with an embodiment of the inventive concept may include a housing 240 having a guide wall 241 and a molding part 242 covering a top surface of a semiconductor chip 220. A heat transfer layer 231a may be formed between a top surface of the molding part 242 and a bottom surface of a heat spreader 230a. The heat transfer layer 231a may be formed to have a greater horizontal width than the semiconductor chip 220. The heat transfer layer 231a may be formed to have the same horizontal width as or a similar horizontal width to the heat spreader 230a. For example, the heat transfer layer 231a may fully cover the bottom surface of the heat spreader 230a.

Referring to FIG. 2B, a semiconductor package 200b in accordance with embodiments of the inventive concept may include a heat transfer layer 231b covering a part or portion and exposing another part or portion of the inner horizontal surface 2420 of the molding part 242. For example, the heat transfer layer 231b may be formed to have a greater horizontal width than the semiconductor chip 220. The heat transfer layer 231b may be formed to expose a part or portion of a bottom surface of a heat spreader 230b.

Referring to FIG. 2C, a semiconductor package 200c in accordance with embodiments of the inventive concept may include a heat transfer layer 231c in contact with the guide wall 241. For example, the heat transfer layer 231c may fully cover the inner horizontal surface 2420 of the housing 240 or molding part 242 and a bottom surface of the heat spreader 230c. The heat transfer layer 231c may surround parts or portions of side surfaces of the heat spreader 230c.

Figure 3A:
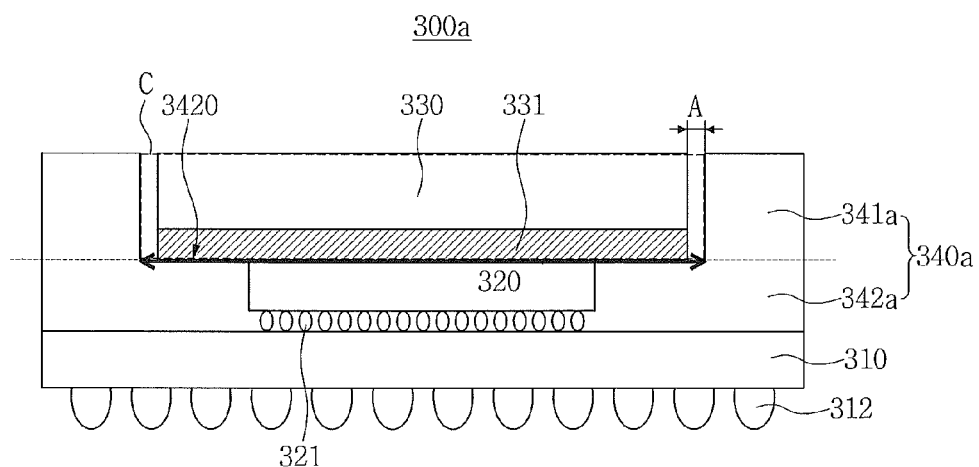
FIG. 3A is a side cross-sectional view schematically showing a semiconductor package in accordance with embodiments of the inventive concept.
Figure 3B:
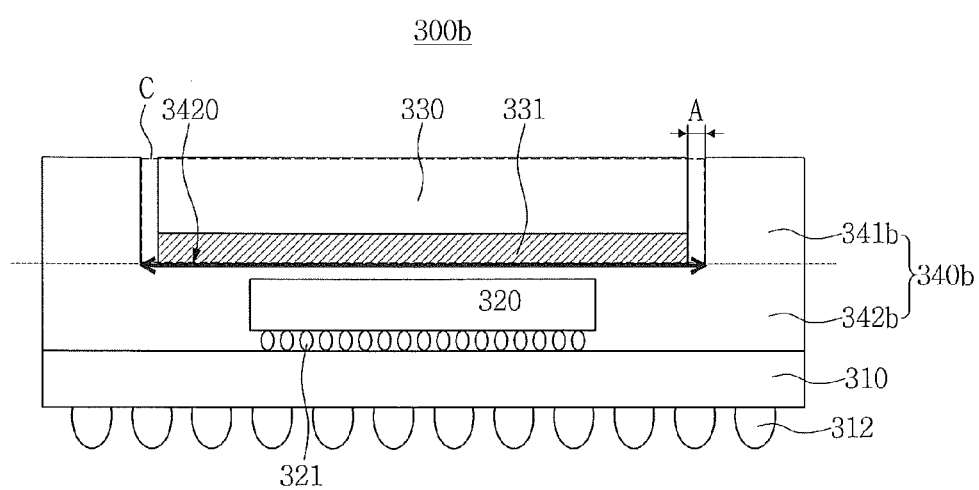
FIG. 3B is a side cross-sectional view schematically showing a semiconductor package in accordance with embodiments of the inventive concept.

FIGS. 3A and 3B are side cross-sectional views schematically showing semiconductor packages in accordance with embodiments of the inventive concept.

Referring to FIG. 3A, a semiconductor package 300a in accordance with embodiments of the inventive concept may include a housing 340a having a molding part 342a which is arranged on a package board 310, directly surrounds side surfaces of chip bumps 321 and semiconductor chip 320, and exposes a top surface of the semiconductor chip 320.

Referring to FIG. 3B, a semiconductor package 300b in accordance with embodiments of the inventive concept may include a housing 340b having a molding part 342b which is arranged on the package board 310 and directly surrounds side surfaces of chip bumps 321 and semiconductor chip 320, and the top surface of the semiconductor chip 320.

Figure 4:
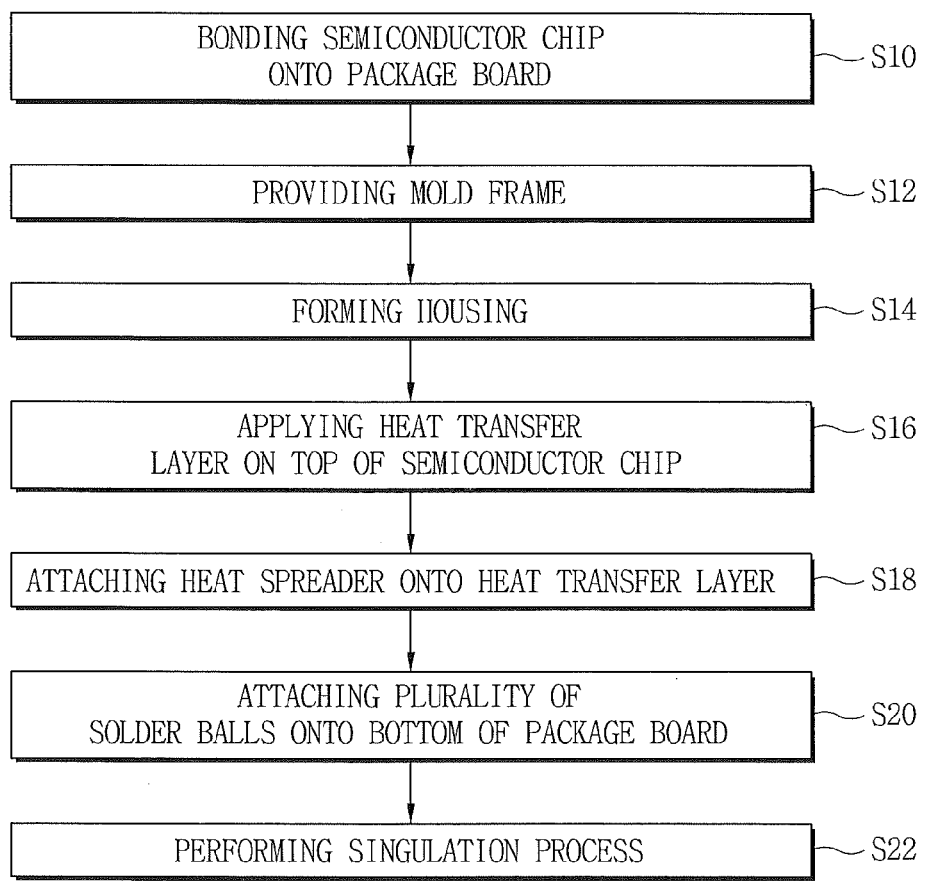
FIG. 4 is a flowchart illustrating a method of forming semiconductor packages in accordance with embodiments of the inventive concept.

FIG. 4 is a flowchart for schematically describing a method of forming semiconductor packages in accordance with embodiments of the inventive concept. FIGS. 5A to 5G are schematic side views for describing a method of forming a semiconductor package in accordance with embodiments of the inventive concept.

Figure 5A:
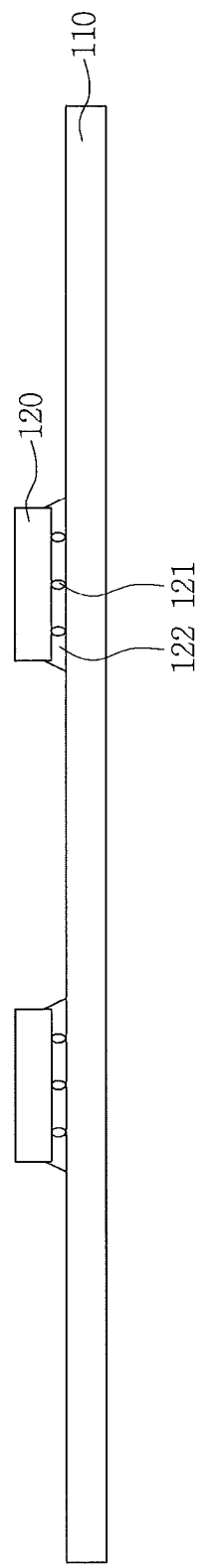
FIGS. 5A to 5G are schematic side cross-sectional views illustrating a method of forming a semiconductor package in accordance with embodiments of the inventive concept.

Referring to FIGS. 4 and 5A, a method of forming a semiconductor package in accordance with embodiments of the inventive concept may include bonding a semiconductor chip 120 on a package board 110 (S10). The semiconductor chip 120 may be bonded to the package board 110 through chip bumps 121 (e.g., the chip bumps 121 may be disposed between the package board 110 and the semiconductor chip 120). Next, an under-fill material 122 surrounding the chip bumps 121 may be used to fill a region or space between the semiconductor chip 120 and the package board 110.

Figure 5B:
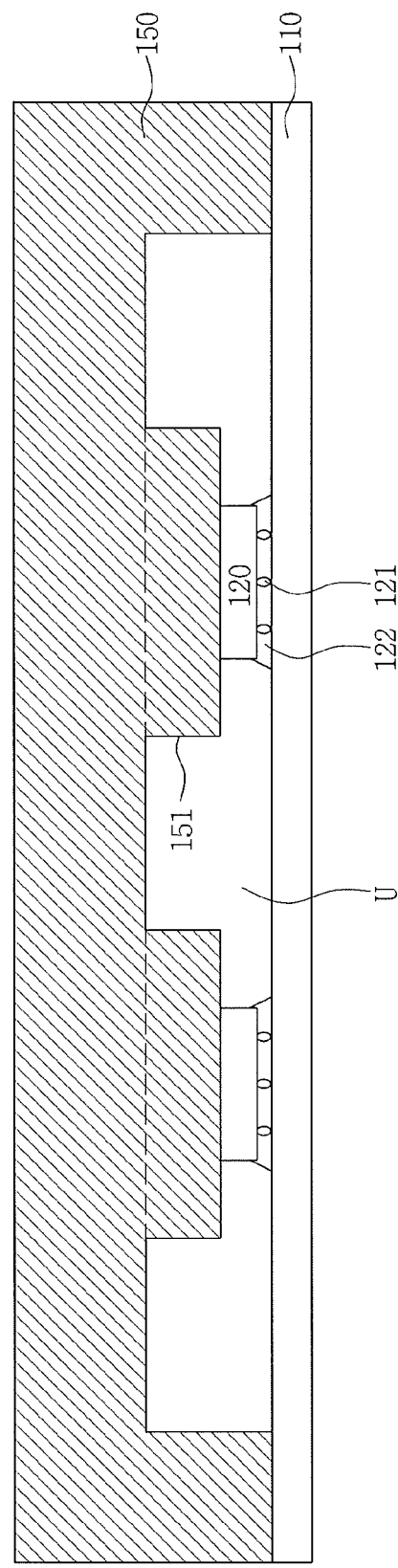

Referring to FIGS. 4 and 5B, a method of forming a semiconductor package in accordance with embodiments of the inventive concept may include providing a mold frame 150 covering the semiconductor chip 120 on a top surface of the package board 110 (S12). The mold frame 150 may define or have a molding space U corresponding to a housing 140. The molding space U of the mold frame 150 may cover a plurality of the semiconductor chips 120. The molding space U of the mold frame 150 may surround at least side surfaces of the semiconductor chip(s) 120. The mold frame 150 may include at least one protrusion 151. The protrusion 151 may be in contact with the top surface of the semiconductor chip 120. The horizontal width of the protrusion 151 may be greater than that of the semiconductor chip 120. A bottom surface of the mold frame 150 may be in contact with the top surface of the package board 110.

Figure 5C:
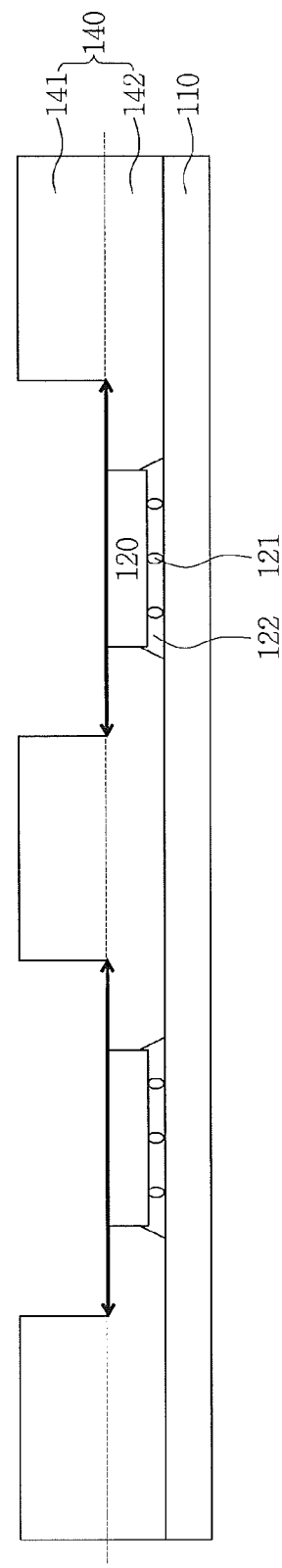

Referring to FIGS. 4 and 5C, a method of forming a semiconductor package in accordance with embodiments of the inventive concept may include forming the housing 140 by injecting a molding material into the molding space U (S14).

Figure 5D:
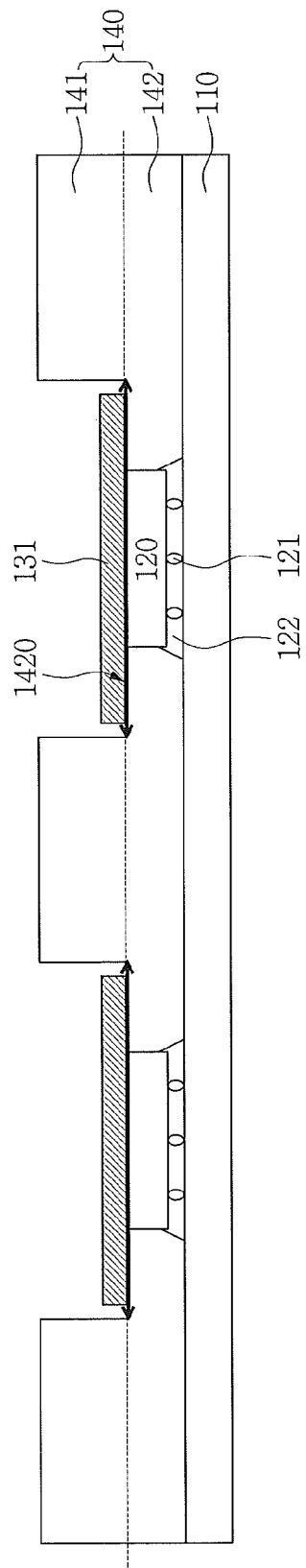

Referring to FIGS. 4 and 5D, a method of forming a semiconductor package in accordance with embodiments of the inventive concept may include applying a heat transfer layer 131 on the top surface of the semiconductor chip 120 (S16). The heat transfer layer 131 may be applied on the top surface of the semiconductor chip 120 and an inner horizontal surface 1420 of the molding part 142.

Figure 5E:
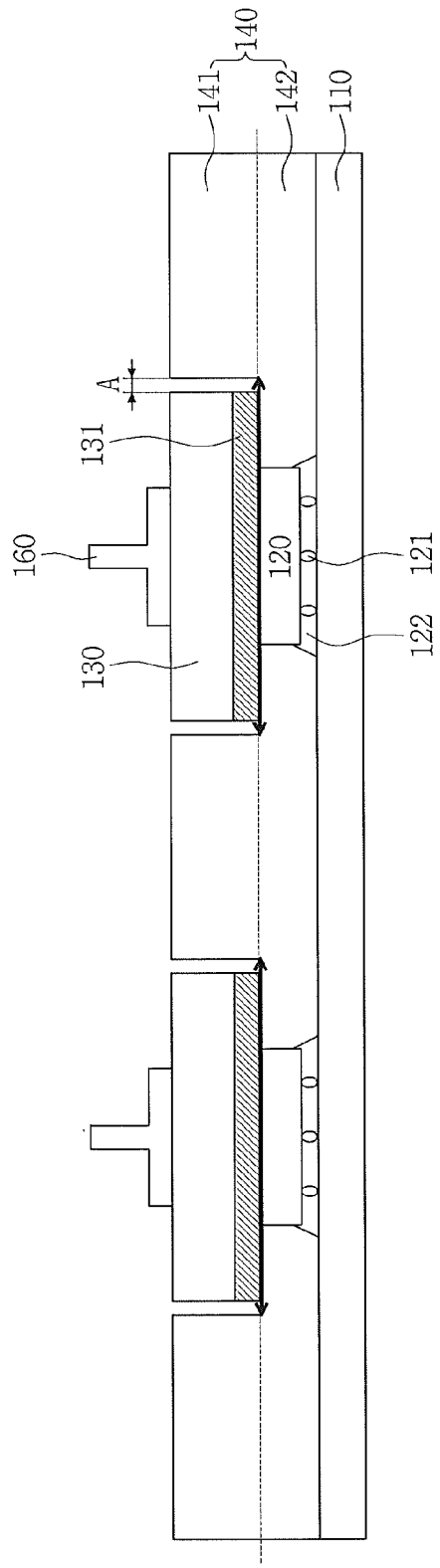

Referring to FIGS. 4 and 5E, a method of forming a semiconductor package in accordance with embodiments of the inventive concept may include attaching a heat spreader 130 to the heat transfer layer 131 (S18). The attachment of the heat spreader 130 may include thermally compressing the heat spreader 130 on the heat transfer layer 131 using a compressor 160.

Figure 5F:
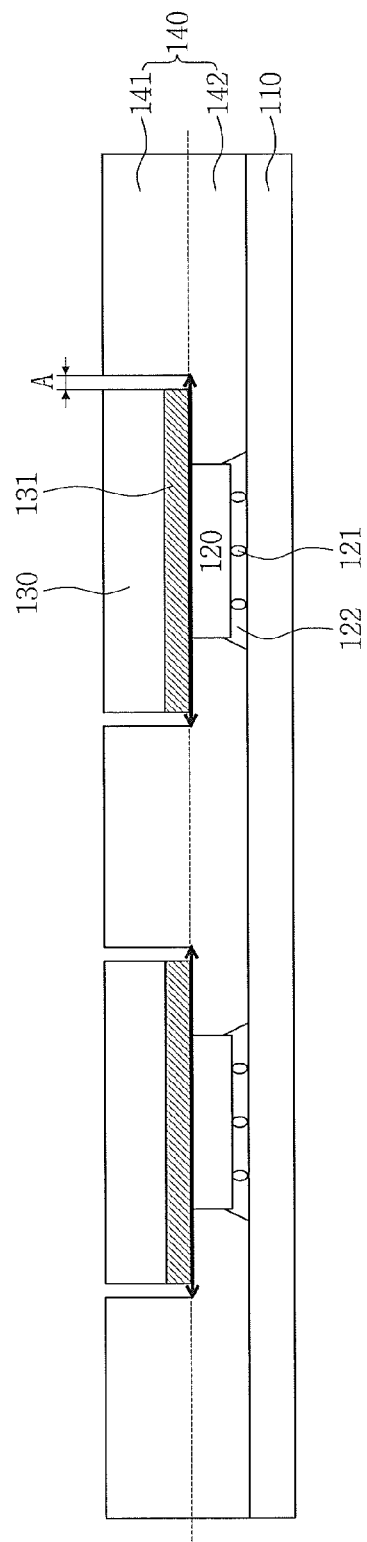

Referring to FIGS. 4 and 5F, a method of forming a semiconductor package in accordance with embodiments of the inventive concept may include attaching a plurality of solder balls 112 to a bottom surface of the package board 110 (S20).

Figure 5G:
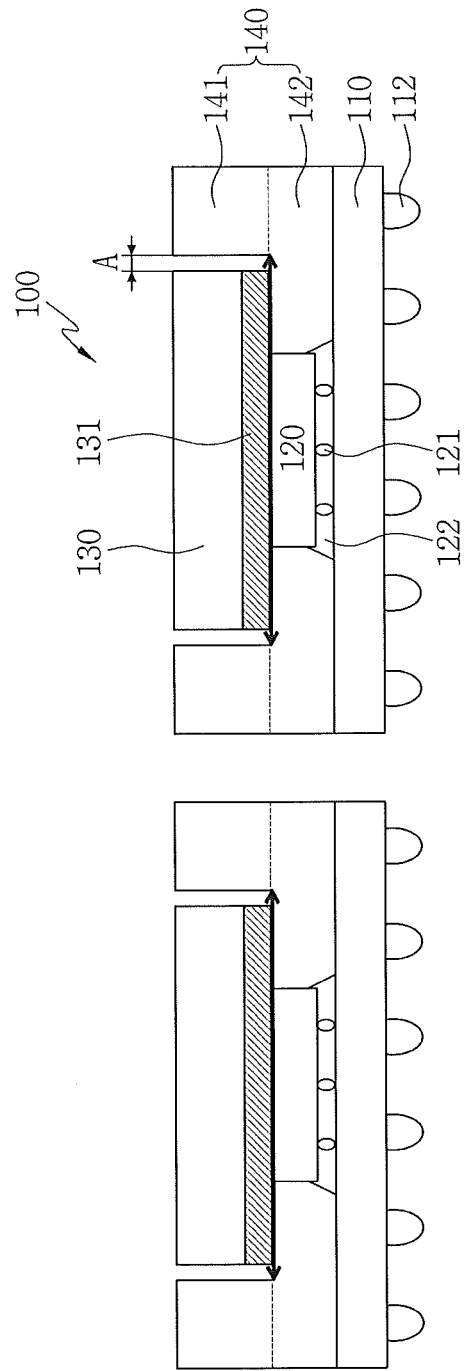

Referring to FIGS. 4 and 5G, a method of forming a semiconductor package in accordance with embodiments of the inventive concept may include fabricating a plurality of semiconductor packages 100 by performing a singulation process (S22).

Figure 6A:
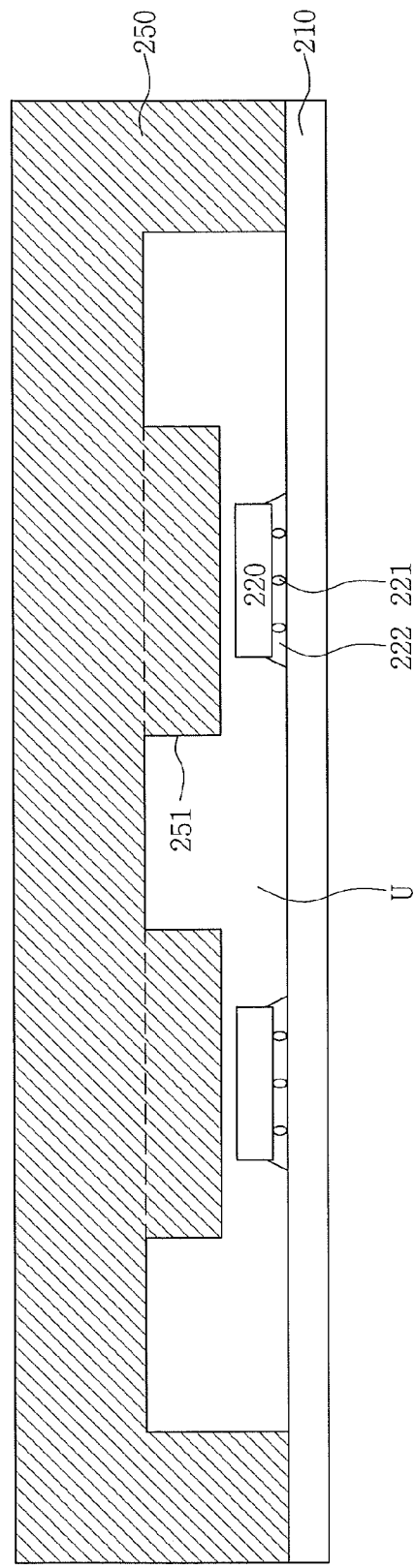
FIGS. 6A to 6C are schematic side cross-sectional views illustrating a method of forming a semiconductor package in accordance with embodiments of the inventive concept.
Figure 6B:
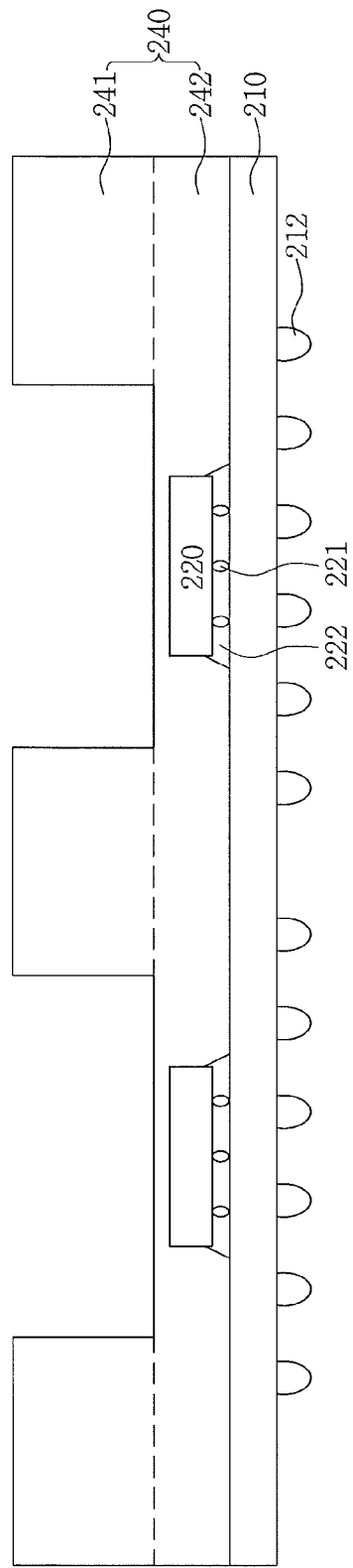
Figure 6C:
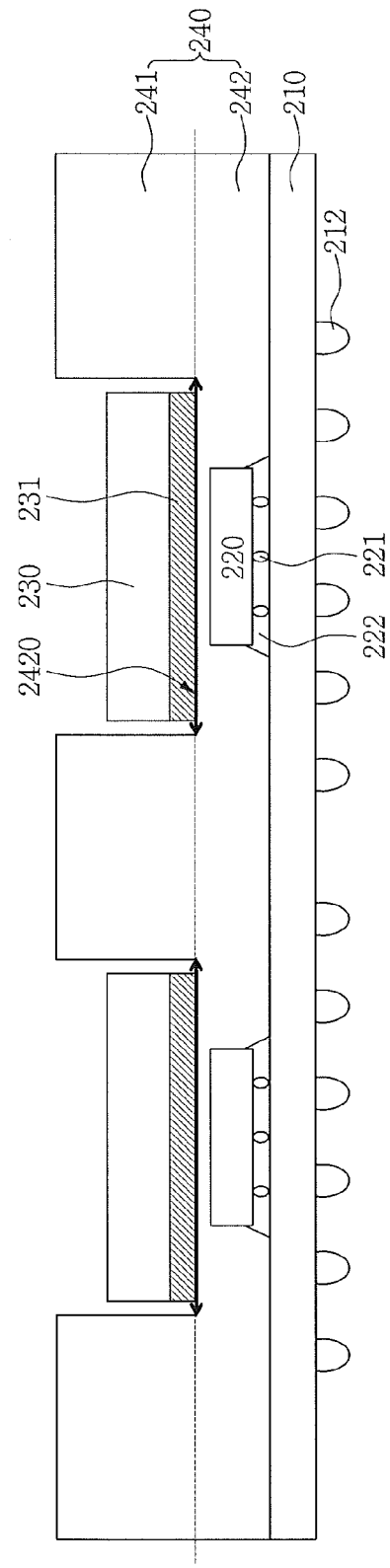

FIGS. 6A to 6C are schematic side cross-sectional views for describing a method of forming a semiconductor package in accordance with embodiments of the inventive concept.

Referring to FIG. 6A, a method of forming a semiconductor package in accordance with embodiments of the inventive concept, further with reference to FIGS. 5A and 5B and descriptions thereof, may include providing a mold frame 250 covering a semiconductor chip 220 on a top surface of a package board 210. The mold frame 250 may define or have a molding space U corresponding to a housing 240. A protrusion 251 of the mold frame 250 may be spaced apart from a top surface of the semiconductor chip 220.

Referring to FIG. 6B, a method of forming a semiconductor package in accordance with embodiments of the inventive concept may include forming the housing 240 by filling the molding space U with a molding material.

Referring to FIG. 6C, a method of forming a semiconductor package in accordance with embodiments of the inventive concept may include, further with reference to FIGS. 5C to 5F and descriptions thereof, applying a heat transfer layer 231 to an inner horizontal surface 2420 of the housing 240 and attaching a heat spreader 230 to the heat transfer layer 231.

Figure 7A:
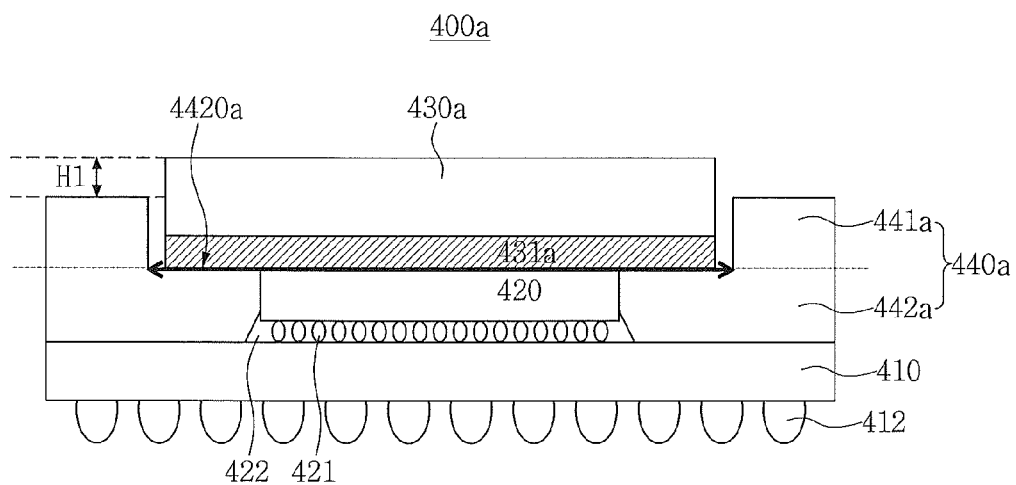
FIG. 7A is a side cross-sectional view schematically showing a semiconductor package in accordance with embodiments of the inventive concept.
Figure 7B:
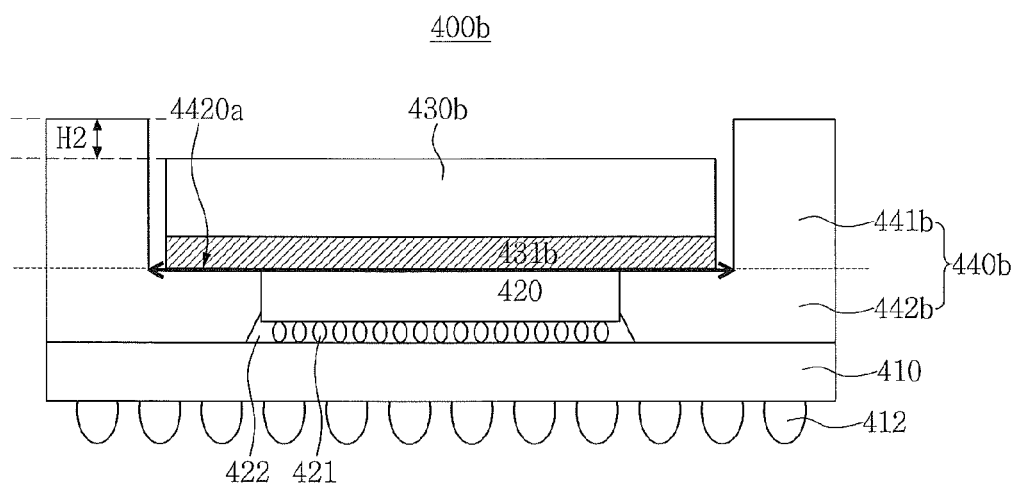
FIG. 7B is a side cross-sectional view schematically showing a semiconductor package in accordance with embodiments of the inventive concept.

FIGS. 7A and 7B are schematic side cross-sectional views for describing semiconductor packages in accordance with embodiments of the inventive concept.

Referring to FIG. 7A, a semiconductor package 400a in accordance with embodiments of the inventive concept may include a heat transfer layer 431a applied on a top surface of a semiconductor chip 420 and a portion of or the entire inner horizontal surface 4420a of a molding part 442a, and a guide wall 441a spaced apart from and surrounding a heat spreader 430a (when viewed from the top) and formed at a lower level than the heat spreader 430a. That is, a top surface of the heat spreader 430a extends above or higher than a top surface of the guide wall 441a by a predetermined height H1. For example, the heat transfer layer 431a may be in direct contact with the top surface of the semiconductor chip 420 and a bottom surface of the heat spreader 430a.

A top surface of the guide wall 441a may be formed to be a predetermined height H1 lower than that of the heat spreader 430a.

Referring to FIG. 7B, a semiconductor package 400b in accordance with embodiments of the inventive concept may include a guide wall 441b formed higher than a heat spreader 430b. For example, a top surface of the guide wall 441b may be formed to be a predetermined height H2 higher than or above a top surface of the heat spreader 430b. That is, a top surface of the guide wall 441b extends above or higher than a top surface of the heat spreader 430b by a predetermined height H2.

Figure 8A:
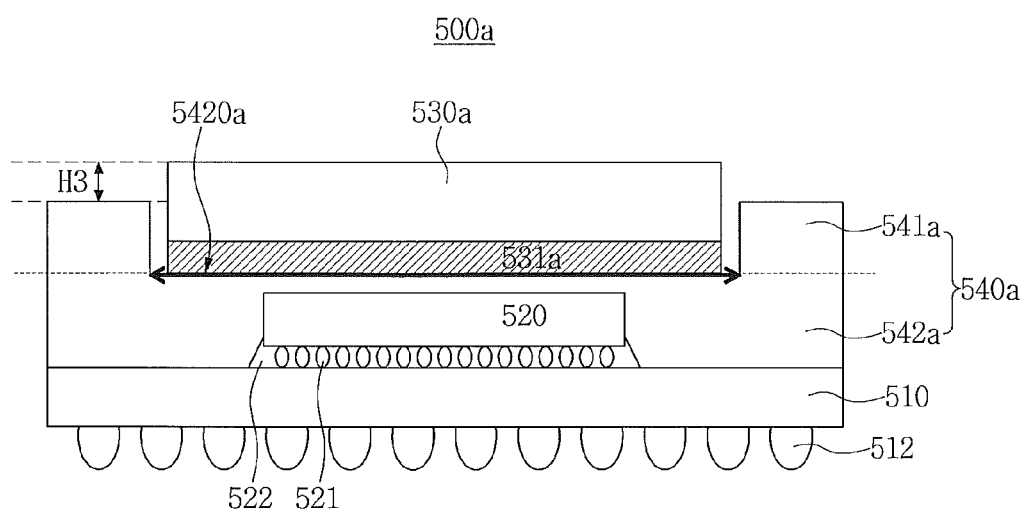
FIG. 8A is a side cross-sectional view schematically showing a semiconductor package in accordance with embodiments of the inventive concept.
Figure 8B:
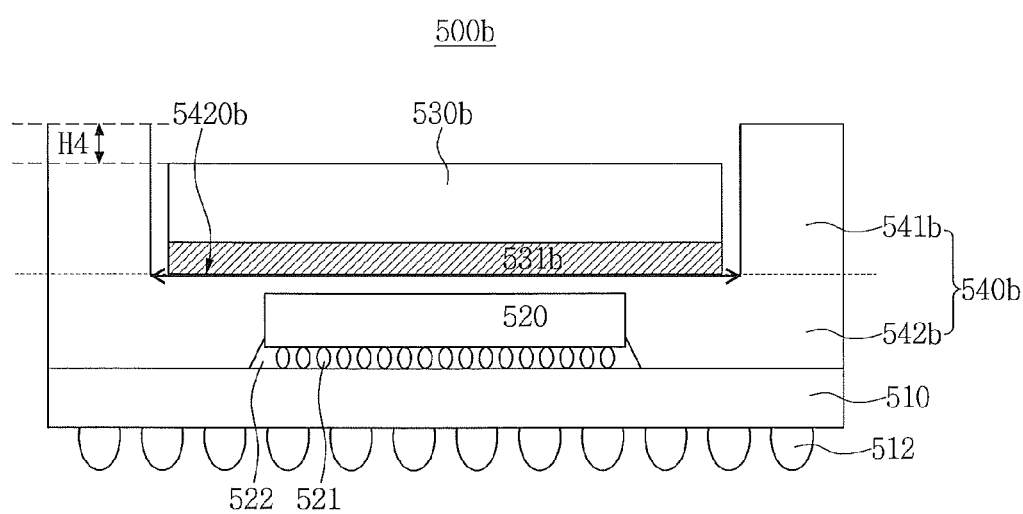
FIG. 8B is a side cross-sectional view schematically showing a semiconductor package in accordance with embodiments of the inventive concept.

FIGS. 8A and 8B are schematic side cross-sectional views for describing a semiconductor packages in accordance with embodiments of the inventive concept.

Referring to FIG. 8A, a semiconductor package 500a in accordance with embodiments of the inventive concept may include a heat transfer layer 531a formed between a top surface of a molding part 542a and a bottom surface of a heat spreader 530a, and a guide wall 541a formed to be lower than the heat spreader 530a. For example, a top surface of the guide wall 541a may be formed to be a predetermined height H3 lower than or below a top surface of the heat spreader 530a.

Referring to FIG. 8B, a semiconductor package 500b in accordance with embodiments of the inventive concept may include a guide wall 541b formed to be higher than a heat spreader 530b. For example, a top surface of the guide wall 541b may be formed to be a predetermined height H4 higher than or above a top surface of the heat spreader 530b.

Figure 9A:
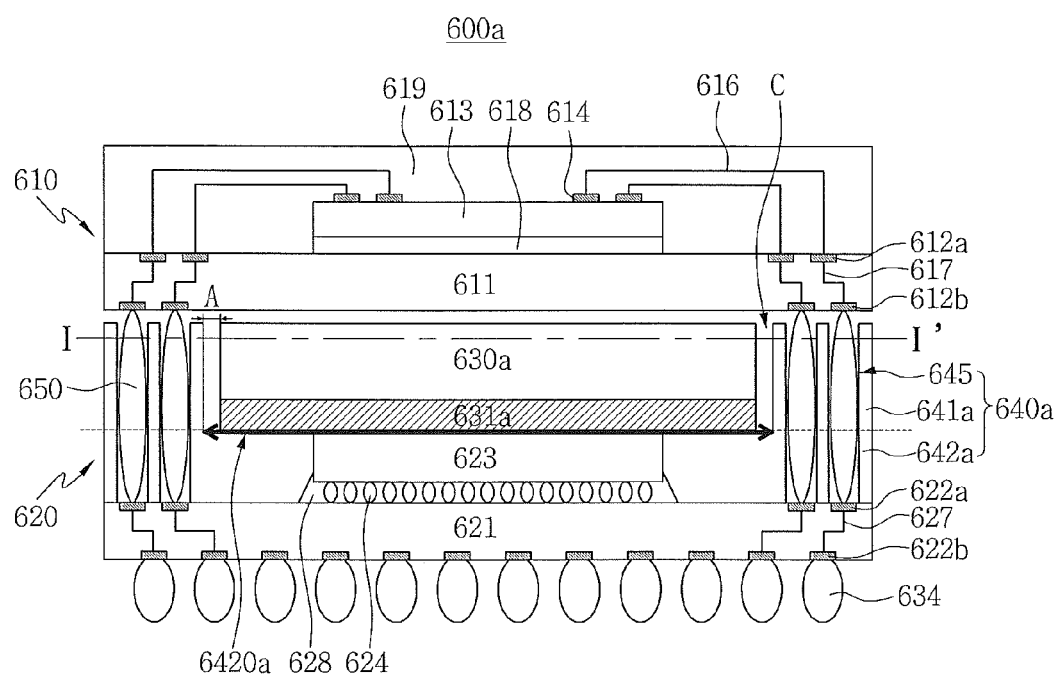
FIG. 9A is a side cross-sectional view schematically showing a semiconductor package including stacked packages in accordance with embodiments of the inventive concept.
Figure 9B:
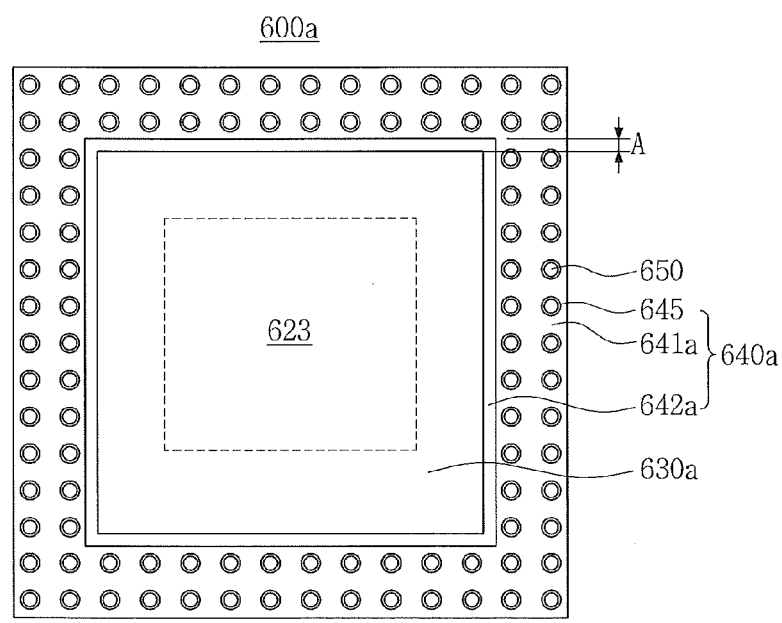
FIG. 9B is a lateral cross-sectional view of the semiconductor package of FIG. 9A.

FIG. 9A is a side cross-sectional view schematically showing a semiconductor package including stacked packages in accordance with embodiments of the inventive concept, and FIG. 9B shows a lateral cross-sectional view of a lower package taken along line I-I' in FIG. 9A.

Referring to FIGS. 9A and 9B, a semiconductor package 600a in accordance with embodiments of the inventive concept may include an upper package 610 and a lower package 620 having a heat spreader 630a. The upper package 610 and the lower package 620 may be electrically connected through a plurality of inter-package bumps 650.

The upper package 610 may include an upper semiconductor chip 613 mounted on an upper package board 611. The upper package board 611 may include first upper lands or contacts 612a exposed at or on a top surface thereof, second upper lands or contacts 612b exposed at or on a bottom surface thereof, and internal upper board wirings 617. The first upper lands 612a may be electrically connected to the second upper lands 612b through the upper board wirings 617.

The upper semiconductor chip 613 may be or include a memory semiconductor device. The upper semiconductor chip 613 may be attached to the upper package board 611 by or through a chip adhesive material 618 such as a die attach film (DAF). The upper semiconductor chip 613 may include bonding pads 614. The bonding pads 614 may be electrically connected to the first upper lands 612a of the upper package board 611 through wires 616. The upper package 610 may further include an upper molding part 619 surrounding top and side surfaces of the upper semiconductor chip 613 and mounted on the upper package board 611. The upper molding part 619 may be or include an epoxy resin.

The lower package 620 may include a lower semiconductor chip 623 mounted on a lower package board 621. The lower package board 621 may include first lower lands or contacts 622a exposed at or on a top surface thereof, second lower lands or contacts 622b exposed at or on a bottom surface thereof, and internal lower board wirings 627. The first lower lands 622a and the second lower lands 622b may be electrically connected through the lower board wirings 627.

The lower semiconductor chip 623 may be or include a logic semiconductor device such as a microprocessor. The lower semiconductor chip 623 may be connected by a flip chip method using chip bumps 624 arranged on the lower package board 621 (e.g., on a top surface of the lower package board 621).

The chip bumps 624 may be or include a mesa-type metal pad or a solder ball.

A lower under-fill material 628 surrounding the chip bumps 624 may fill a region or space between the lower package board 621 and the lower semiconductor chip 623. The lower under-fill material 628 may be or include an adhesive resin. For example, the lower under-fill material 628 may be or include a rosin resin, an epoxy resin, or a variety of other synthetic resins. The lower under-fill material 628 may be omitted.

A housing 640a may include a molding part 642a and a guide wall 641a disposed on the molding part 642a. A plurality of inter-package bumps 650 may pass through the housing 640a. The housing 640a and/or the molding part 642a may include a through-hole 645. The through-hole 645 may expose a part of a surface of the lower package board 621, for example, the first lower lands 622a.

The guide wall 641a may be arranged on the molding part 642a to be spaced apart from and surround the heat spreader 630a. The guide wall 641a may define a cavity C in which the heat spreader 630a is arranged. An inner horizontal surface 6420a of the molding part 642a may be delimited in the cavity C.

The molding part 642a may be arranged on the lower package board 621 and directly surround the under-fill material 628 and sides of the lower semiconductor chip 623. The inner horizontal surface 6420a may be the same as or similar to a top surface of the lower semiconductor chip 623 (e.g., the surfaces may be coplanar or substantially coplanar). The top surface of the lower semiconductor chip 623 may be not covered with the molding part 642a but rather may be exposed. The guide wall 641a may be spaced apart from and surround the heat spreader 630a. A top surface of the guide wall 641a and a top surface of the heat spreader 630a may be similar or substantially the same (e.g., the surfaces may be coplanar or substantially coplanar). The guide wall 641a and the molding part 642a may be one monolithic body. For example, the guide wall 641a and the molding part 642a may include the same material or be physically continuous.

The heat spreader 630a may be attached to the top surface of the lower semiconductor chip 623 and the inside of the housing 640a by a heat transfer layer 631a. The heat transfer layer 631a may be applied to the top surface of the lower semiconductor chip 623 and to a portion or the entire inner horizontal surface 6420a of the molding part 642a. The heat transfer layer 631a may be in direct contact with the top surface of the lower semiconductor chip 623 and a bottom surface of the heat spreader 630a.

The heat transfer layer 631a may fully cover the top surface of the lower semiconductor chip 623. The heat transfer layer 631a may fully cover the bottom surface of the heat spreader 630a. The heat transfer layer 631a may cover a part or portion of the inner horizontal surface 6420a of the molding part 642a and expose another part or portion of the inner horizontal surface 6420a of the molding part 642a. The heat spreader 630a and/or the heat transfer layer 631a may be spaced apart from the guide wall 641a by a predetermined distance A. In FIG. 9B, since the lower semiconductor chip 623 may be hidden by the heat spreader 630a, the lower semiconductor chip 623 is indicated by a dotted line.

The inter-package bumps 650 may pass through the housing 640a to be arranged between the first lower lands 622a arranged on the top surface of the lower package board 621 and the second upper lands 612b arranged on the bottom surface of the upper package board 611. The inter-package bumps 650 may electrically connect the first lower lands 622a and the second upper lands 612b. The inter-package bumps 650 may be or include a solder material.

Figure 10A:
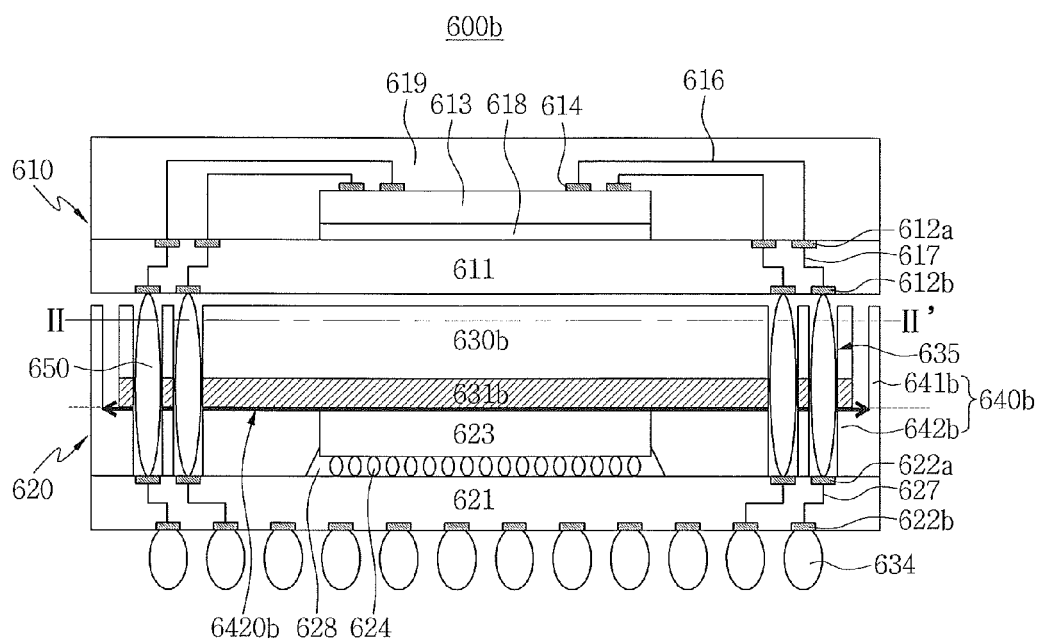
FIG. 10A is a side cross-sectional view schematically showing a semiconductor package including stacked packages in accordance with embodiments of the inventive concept.
Figure 10B:
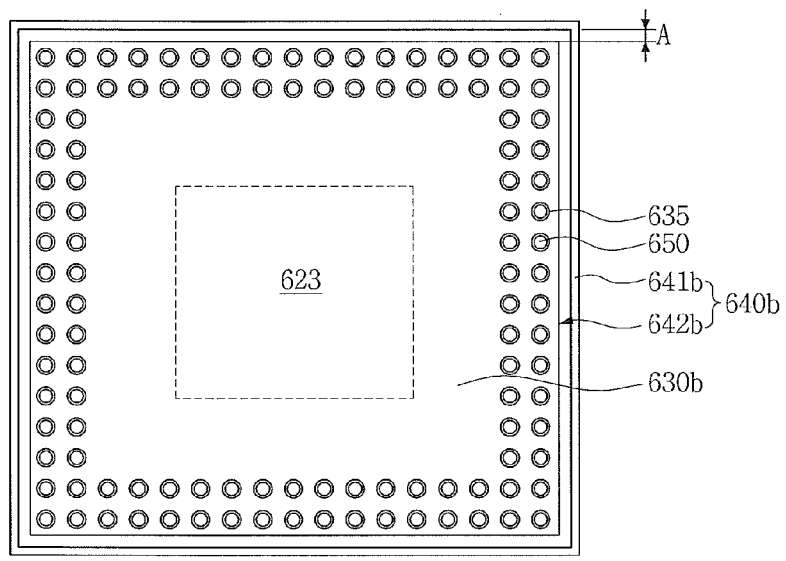
FIG. 10B is a lateral cross-sectional view of the semiconductor package of FIG. 10A.
Figure 10C:
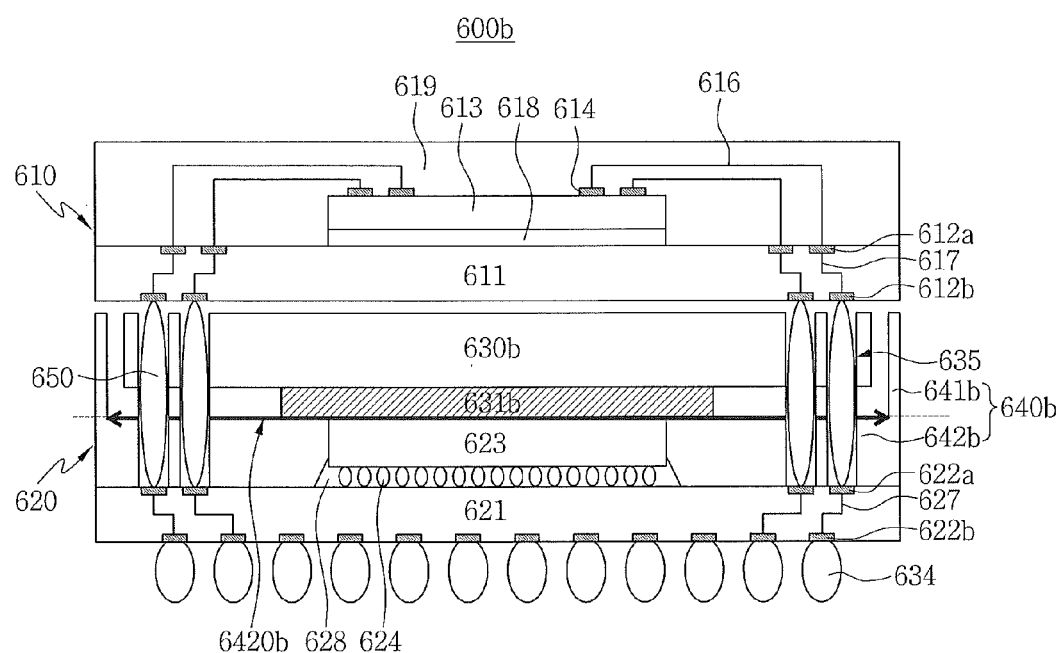
FIG. 10C is a side cross-sectional view schematically showing a semiconductor package including stacked packages in accordance with embodiments of the inventive concept.

FIGS. 10A and 10C are side cross-sectional views schematically showing semiconductor packages including stacked packages in accordance with embodiments of the inventive concept, and FIG. 10B shows a lateral cross-sectional view of a lower package taken along line II-II' in FIG. 10A.

Referring to FIGS. 10A and 10B, a semiconductor package 600b in accordance with embodiments of the inventive concept may include a heat spreader 630b having through-holes 635 and a housing 640b. The inter-package bumps 650 may pass through the through-holes 635 of the heat spreader 630b (which through-holes may be aligned with through-holes of the molding part 642b).

Referring to FIG. 10C, the semiconductor package 600b in accordance with embodiments of the inventive concept may include a heat transfer layer 631b fully covering the top surface of the lower semiconductor chip 623 and formed on a part or portion of an inner horizontal surface 6420b of a molding part 642b. For example, the heat transfer layer 631b may cover a part or portion and expose another part or portion of the inner horizontal surface 6420b of the molding part 642b. The heat transfer layer 631b may cover a part or portion and expose another part or portion of the bottom surface of the heat spreader 630b. The heat transfer layer 631b may be spaced apart from the inter-package bumps 650.

Figure 11A:
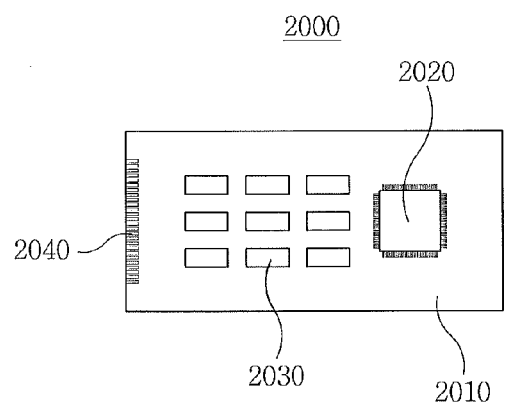
FIG. 11A is a diagram schematically showing a semiconductor module including a semiconductor package in accordance with embodiments of the inventive concept.

FIG. 11A is a diagram schematically showing a semiconductor module including a semiconductor package in accordance with embodiments of the inventive concept. Referring to FIG. 11A, a semiconductor module 2000 in accordance with embodiments of the inventive concept may include a semiconductor device 2030 disposed on a module substrate 2010, and the semiconductor device 2030 may include at least one of the semiconductor packages in accordance with various embodiments of the inventive concept. The semiconductor module 2000 may further include a microprocessor 2020 mounted on the module substrate 2010. Input/output terminals 2040 may be arranged in or on at least one of the edges of the module substrate 2010. The semiconductor device 2030 may be mounted on the module substrate 2010 using a flip chip method, etc.

Figure 11B:
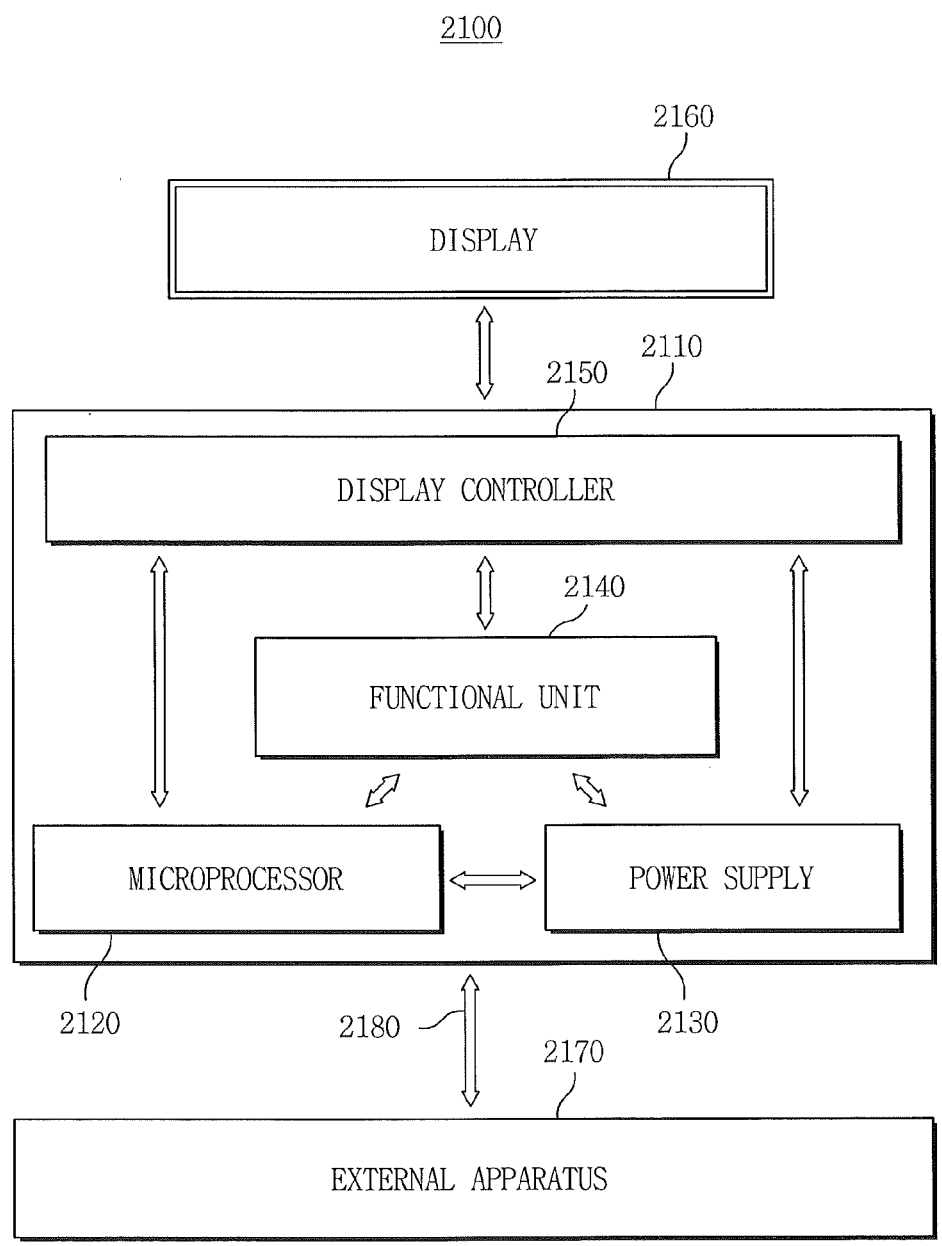
FIG. 11B is a block diagram schematically showing an electronic system including a semiconductor package in accordance with embodiments of the inventive concept.

FIG. 11B is a block diagram schematically showing an electronic system including a semiconductor package in accordance with embodiments of the inventive concept. Referring to FIG. 11B, at least one of the semiconductor packages in accordance with various embodiments of the inventive concept may be applied to the electronic system 2100. The electronic system 2100 may include a body 2110, a microprocessor 2120, a power supply 2130, a function unit 2140, and/or a display controller 2150. The body 2110 may be a system board or mother board having a printed circuit board (PCB), etc. The microprocessor 2120, the power supply 2130, the function unit 2140, and the display controller 2150 may be mounted or installed on the body 2110. A display 2160 may be installed on the body 2110 or outside of the body 2110. For example, the display 2160 may be disposed on a surface of the body 2110 to display an image processed by the display controller 2150. The power supply 2130 may function to receive a constant voltage from an external battery, etc., divide the voltage into required levels, and supply those voltages to the microprocessor 2120, the function unit 2140, and the display controller 2150. The microprocessor 2120 may receive the voltage from the power supply 2130 to control the function unit 2140 and the display 2160. The function unit 2140 may perform functions of various electronic systems 2100. For example, if the electronic system 2100 is a mobile terminal such as a cellular phone, the function unit 2140 may have several components which can perform wireless communication functions such as dialing, video output to the display 2160 through communication with the external apparatus 2170, and sound output to a speaker, and if a camera is installed, the function unit 2140 may function as a camera image processor. In embodiments to which the inventive concept is applied, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. Further, when the electronic system 2100 needs a universal serial bus (USB), etc. in order to expand functionality, the function unit 2140 may function as an interface controller. At least one of the semiconductor packages in accordance with various embodiments of the inventive concept may be included in one of the microprocessor 2120 or the function unit 2140.

Figure 11C:
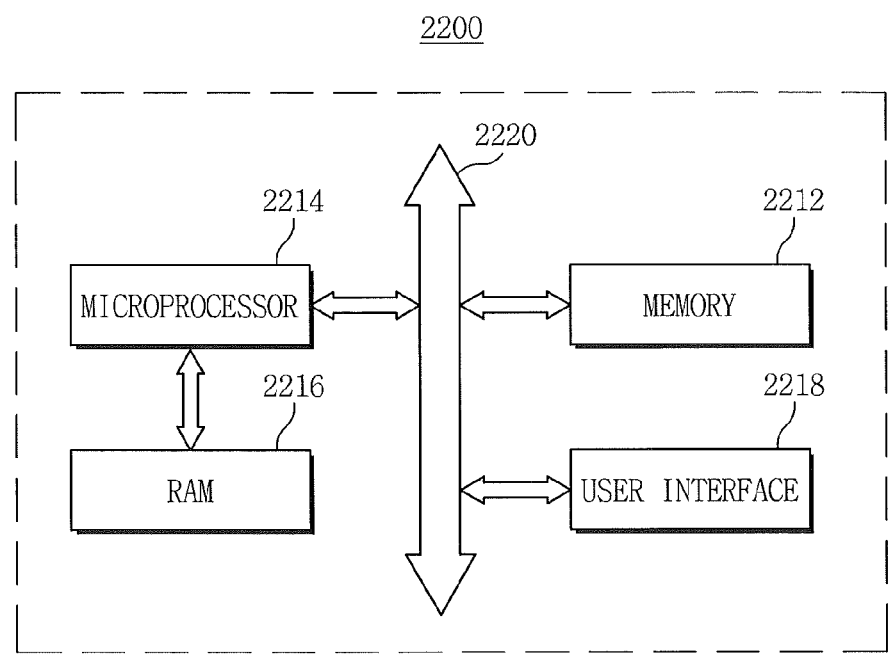
FIG. 11C is a block diagram schematically showing an electronic system including a semiconductor package in accordance with embodiments of the inventive concept.

FIG. 11C is a block diagram schematically showing an electronic system including a semiconductor package in accordance with embodiments of the inventive concept. Referring to FIG. 11C, the electronic system 2200 may include at least one of the semiconductor packages in accordance with various embodiments of the inventive concept. The electronic system 2200 may be included in a mobile apparatus or a computer. For example, the electronic system 2200 may include a memory system 2212, a microprocessor 2214, a RAM 2216, and a user interface 2218 performing data communication using a bus 2220. The microprocessor 2214 may program and control the electronic system 2200. The RAM 2216 may be used as an operation memory of the microprocessor 2214. For example, the microprocessor 2214 and/or the RAM 2216 may include a semiconductor device or a semiconductor package in accordance with the embodiments of the inventive concept. The microprocessor 2214, the RAM 2216, and/or other components may be assembled in a single package. The user interface 2218 may be used to input data to or output data from the electronic system 2200. The memory system 2212 may store codes for operating the microprocessor 2214, data processed by the microprocessor 2214, or external input data. The memory system 2212 may include a controller and a memory.

Figure 11D:
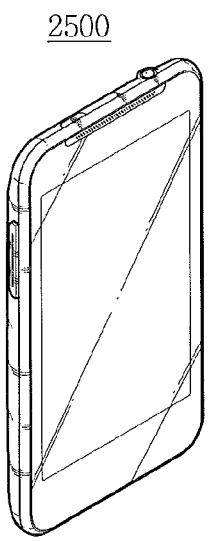
FIG. 11D is a perspective view schematically showing a mobile wireless terminal in accordance with embodiments of the inventive concept.

FIG. 11D is a view showing a mobile wireless phone or terminal in accordance with embodiments of the inventive concept. The mobile wireless phone 2500 or terminal may be a tablet PC. In addition, at least one of the semiconductor packages in accordance with various embodiments of the inventive concept may be used in a portable computer such as a notebook, an MPEG-1 Audio Layer 3 (MP3) player, an a MP4 player, a navigation apparatus, a solid state disk (SSD), a desktop computer, an automobile, or a home appliance as well as a tablet PC.

The semiconductor packages in accordance with embodiments of the inventive concept may prevent a misalignment due to a slip or rotation between a heat spreader and a package by being equipped with a guide wall.

In addition, the semiconductor packages in accordance with embodiments of the inventive concept may be applied to a small form factor (SFF) electronic product by being equipped with a guide wall.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A semiconductor package, comprising:
   a first package board;
   a first semiconductor chip arranged on the first package board;
   a heat transfer layer arranged on the first semiconductor chip;
   a heat spreader arranged on the heat transfer layer; and
   a housing including:
      a molding part arranged on the first package board and directly surrounding side surfaces of the first semiconductor chip, and
      a guide wall arranged on the molding part, the guide wall spaced apart from the heat spreader and surrounding side surfaces of the heat spreader,
   wherein:
      the heat transfer layer surrounds at least a portion of the side surfaces of the heat spreader;
      the guide wall defines a cavity in which the heat spreader is arranged on the first semiconductor chip;
      the guide wall defines an inner horizontal surface on a top surface of the molding part; and
      the first semiconductor chip has a top surface, and wherein the heat transfer layer covers the entire top surface of the first semiconductor chip and at least a portion of the inner horizontal surface.

2. The semiconductor package of claim 1, wherein the guide wall surrounds four side surfaces of the heat spreader.

3. The semiconductor package of claim 1, wherein the top surface of the first semiconductor chip and the inner horizontal surface are substantially coplanar.

4. The semiconductor package of claim 1, wherein the guide wall and the molding part form a monolithic structure.

5. The semiconductor package of claim 1, further comprising:
   a second package board arranged on the housing;
   a second semiconductor chip arranged on the second package board; and
   a plurality of inter-package bumps arranged between a bottom surface of the second package board and a top surface of the first package board, wherein each inter-package bump passes through the housing.

6. The semiconductor package of claim 5, wherein the inter-package bumps pass through the heat spreader.

7. The semiconductor package of claim 6, wherein the heat spreader includes through-holes through which the inter-package bumps pass.

8. A semiconductor package, comprising:
   a package board;
   a semiconductor chip arranged on the package board;
   a molding part arranged on the package board and surrounding side surfaces of the semiconductor chip, the molding part including a top surface outer periphery and an inner top surface extending inwardly from the top surface outer periphery;
   a heat transfer layer formed on at least a portion of the inner top surface of the molding part;
   a heat spreader arranged on the heat transfer layer; and
   a guide wall extending away from the top surface outer periphery of the molding part, wherein the guide wall is spaced apart from the heat spreader such that a gap is formed between the guide wall and the heat spreader, and wherein the guide wall surrounds side surfaces of the heat spreader,
   wherein:
      the heat transfer layer fills at least a portion of the gap; and
      the molding part includes an opening that exposes a top surface of the semiconductor chip, and wherein the heat transfer layer fully covers the top surface of the semiconductor chip and exposes a portion of the inner top surface of the molding part.

9. A semiconductor package, comprising:
   a package board;
   a semiconductor chip arranged on the package board;
   a molding part arranged on the package board and surrounding side surfaces of the semiconductor chip, the molding part including a top surface outer periphery and an inner top surface extending inwardly from the top surface outer periphery;
   a heat transfer layer formed on at least a portion of the inner top surface of the molding part;
   a heat spreader arranged on the heat transfer layer; and
   a guide wall extending away from the top surface outer periphery of the molding part, wherein the guide wall is spaced apart from the heat spreader such that a gap is formed between the guide wall and the heat spreader, and wherein the guide wall surrounds side surfaces of the heat spreader,
   wherein:
      the heat transfer layer fills at least a portion of the gap; and
      the molding part includes an opening that exposes a top surface of the semiconductor chip, and wherein the heat transfer layer fully covers the top surface of the semiconductor chip and the inner top surface of the molding part.

10. The semiconductor package of claim 9, wherein the molding part includes a first through-hole extending downwardly from the inner top surface of the molding part and exposing a portion of a surface of the package board.

11. The semiconductor package of claim 10, wherein the heat spreader includes a second through-hole aligned with the first through-hole.

12. A semiconductor package, comprising:
   a package board;
   a semiconductor chip arranged on the package board, the semiconductor chip having an upper surface;
   a housing that surrounds side surfaces of the semiconductor chip, the housing including a perimeter wall that extends substantially perpendicularly away from the upper surface of the semiconductor chip, the housing including an inner upper surface extending inwardly from a base of the perimeter wall;

a heat transfer layer arranged on at least a portion of the inner upper surface of the housing; and a heat spreader arranged on the heat transfer layer, wherein the perimeter wall is spaced apart from the heat spreader and at least partially surrounds side surfaces of the heat spreader, wherein the heat transfer layer fully covers the upper surface of the semiconductor chip.

13. The semiconductor package of claim 12, wherein the housing includes an opening exposing the upper surface of the semiconductor chip, and wherein the upper surface of the semiconductor chip and the inner upper surface of the housing are substantially coplanar.

14. The semiconductor package of claim 12, wherein the perimeter wall extends past an upper surface of the heat spreader such that the perimeter wall completely surrounds sides surfaces of the heat spreader.

15. The semiconductor package of claim 12, wherein an upper surface of the heat spreader extends past the perimeter wall such that the perimeter wall partially surrounds sides surfaces of the heat spreader.

\* \* \* \* \*